(12) United States Patent
Thie et al.

(10) Patent No.: US 8,314,027 B2
(45) Date of Patent: Nov. 20, 2012

(54) WAFER ELECTROLESS PLATING SYSTEM AND ASSOCIATED METHODS

(75) Inventors: William Thie, Mountain View, CA (US); John M. Boyd, Woodlawn (CA); Fritz C. Redeker, Fremont, CA (US); Yezdi Dordi, Palo Alto, CA (US); John Parks, Hercules, CA (US); Tiruchirapalli Arunagiri, Fremont, CA (US); Aleksander Owczarz, San Jose, CA (US); Todd Balisky, Corona, CA (US); Clint Thomas, Milpitas, CA (US); Jacob Wylie, Fremont, CA (US); Alan M. Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/284,709

(22) Filed: Oct. 28, 2011

(65) Prior Publication Data

US 2012/0045897 A1  Feb. 23, 2012

Related U.S. Application Data

(62) Division of application No. 11/735,984, filed on Apr. 16, 2007, now Pat. No. 8,069,813.

(51) Int. Cl.
*H01L 21/30* (2006.01)
*C25D 1/00* (2006.01)
(52) U.S. Cl. .............. 438/678; 438/800; 204/298.26
(58) Field of Classification Search ............ 204/298.26; 438/678, 800
See application file for complete search history.

*Primary Examiner* — William D Coleman
(74) *Attorney, Agent, or Firm* — Martine Penilla Group, LLP

(57) ABSTRACT

A dry-in/dry-out system is disclosed for wafer electroless plating. The system includes an upper zone for wafer ingress/egress and drying operations. Proximity heads are provided in the upper zone to perform the drying operations. The system also includes a lower zone for electroless plating operations. The lower zone includes an electroless plating apparatus that implements a wafer submersion by fluid upwelling method. The upper and lower zones of the system are enclosed by a dual-walled chamber, wherein the inner wall is a chemically inert plastic and the outer wall is a structural metal. The system interfaces with a fluid handling system which provides the necessary chemistry supply and control for the system. The system is ambient controlled. Also, the system interfaces with an ambient controlled managed transfer module (MTM).

15 Claims, 11 Drawing Sheets

WAFER ELECTROLESS PLATING SYSTEM AND ASSOCIATED METHODS

CLAIM OF PRIORITY

This application is a divisional application of U.S. patent application Ser. No. 11/735,984, filed on Apr. 16, 2007 now U.S. Pat. No. 8,069,813, entitled "Wafer Electroless Plating System and Associated Methods." The above-identified patent applications is incorporated herein by reference in its entirety.

CROSS REFERENCE TO RELATED APPLICATIONS

This application is related to U.S. patent application Ser. No. 11/735,987, filed on Apr. 16, 2007, entitled "Method and Apparatus for Wafer Electroless Plating," and U.S. patent application Ser. No. 11/735,989, filed on Apr. 16, 2007, entitled "Fluid Handling System for Wafer Electroless Plating and Associated Methods," and U.S. patent application Ser. No. 11/639,752, filed on Dec. 15, 2006, entitled "Controlled Ambient System for Interface Engineering," and U.S. Pat. No. 7,045,018, entitled "Substrate Brush Scrubbing and Proximity Cleaning-Drying Sequence Using Compatible Chemistries, and Method, Apparatus, and System for Implementing the Same," and U.S. patent application Ser. No. 11/016,381, filed on Dec. 16, 2004, entitled "System Method and Apparatus for Dry-in, Dry-out Low Defect Laser Dicing Using Proximity Technology," and U.S. patent application Ser. No. 10/882,716, filed on Jun. 30, 2004, entitled "Proximity Substrate Preparation Sequence, and Method, Apparatus, and System for Implementing the Same," and U.S. patent application Ser. No. 11/382,906, filed on May 11, 2006, entitled "Plating Solution for Electroless Deposition of Copper," and U.S. patent application Ser. No. 11/427,266, filed on Jun. 28, 2006, entitled "Plating Solutions for Electroless Deposition of Copper," and U.S. patent application Ser. No. 11/639,012, filed on Dec. 13, 2006, entitled "Self Assembled Monolayer for Improving Adhesion Between Copper and Tantalum," and U.S. patent application Ser. No. 11/591,310, filed on Oct. 31, 2006, entitled "Methods of Fabricating a Barrier Layer with Varying Composition for Copper Metallization," and U.S. patent application Ser. No. 11/552,794, filed on Oct. 25, 2006, entitled "Apparatus and Method for Substrate Electroless Plating," and U.S. Pat. No. 7,153,400, entitled "Apparatus and Method for Depositing and Planarizing Thin Films of Semiconductor Wafers," and U.S. patent application Ser. No. 11/539,155, filed on Oct. 5, 2006, entitled "Electroless Plating Method and Apparatus," and U.S. patent application Ser. No. 11/611,758, filed on Dec. 15, 2006, entitled "Method for Gap Fill in Controlled Ambient System." The disclosure of each of the above-identified related applications is incorporated herein by reference in its entirety.

BACKGROUND OF THE INVENTION

In the fabrication of semiconductor devices such as integrated circuits, memory cells, and the like, a series of manufacturing operations are performed to define features on semiconductor wafers ("wafers"). The wafers include integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

To build an integrated circuit, transistors are first created on the surface of the wafer. The wiring and insulating structures are then added as multiple thin-film layers through a series of manufacturing process steps. Typically, a first layer of dielectric (insulating) material is deposited on top of the formed transistors. Subsequent layers of metal (e.g., copper, aluminum, etc.) are formed on top of this base layer, etched to create the conductive lines that carry the electricity, and then filled with dielectric material to create the necessary insulators between the lines.

Although copper lines are typically comprised of a PVD seed layer (PVD Cu) followed by an electroplated layer (ECP Cu), electroless chemistries are under consideration for use as a PVD Cu replacement, and even as a ECP Cu replacement. Electroless copper (Cu) and electroless cobalt (Co) are potential techniques for improving interconnect reliability and performance. Electroless Cu can be used to form a thin conformal seed layer on a conformal barrier to optimize a gapfill process and minimize void formation. Further, deposition of a selective Co capping layer on planarized Cu lines can improve adhesion of the dielectric barrier layer to the Cu lines, and suppress void formation and propagation at the Cu-dielectric barrier interface.

During the electroless plating process, electrons are transferred from a reducing agent to the Cu (or Co) ions in the solution resulting in the deposition of reduced Cu (or Co) onto the wafer surface. The formulation of the electroless copper plating solution is optimized to maximize the electron transfer process involving the Cu (or Co) ions in solution. The plating thickness achieved through the electroless plating process is dependent on the residency time of the electroless plating solution on the wafer. Because the electroless plating reactions occur immediately and continuously upon exposure of the wafer to the electroless plating solution, it is desirable to perform the electroless plating process in a controlled manner and under controlled conditions. To this end, a need exists for an improved electroless plating apparatus.

SUMMARY OF THE INVENTION

In one embodiment, a semiconductor wafer electroless plating system is disclosed. The system includes a chamber equipped to receive a wafer in a dry state from an interfacing module. The chamber is equipped to perform an electroless plating process on the wafer within the chamber. Also, the chamber is equipped to perform a drying process on the wafer within the chamber. The chamber is defined such that the electroless plating process and the drying process are performed within a common internal volume of the chamber. The chamber is further equipped to provide the wafer in a dry state to the interfacing module.

In another embodiment, a chamber for semiconductor wafer electroless plating is disclosed. The chamber includes a first wafer processing zone defined within an upper region of an internal volume of the chamber. The first wafer processing zone is equipped to perform a drying process on a wafer when disposed within the first wafer processing zone. The chamber also includes a second wafer processing zone defined within a lower region of the internal volume of the chamber. The second wafer processing zone is equipped to perform an electroless plating process on the wafer when disposed within the second wafer processing zone. The chamber further includes a platen defined to support the wafer within the second wafer processing zone and transport the wafer between each of the first and second wafer processing zones.

In another embodiment, a method is disclosed for operating a semiconductor wafer electroless plating system. The method includes an operation for receiving a wafer in a dry state within a chamber volume. The method also includes performing an electroless plating process on the wafer within the chamber volume. Then, a rinsing process is performed on the wafer within the chamber volume. Also, following the rinsing process, a drying process is performed on the wafer within the chamber volume. The method further includes an operation for providing the wafer in a dry state from the chamber volume.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
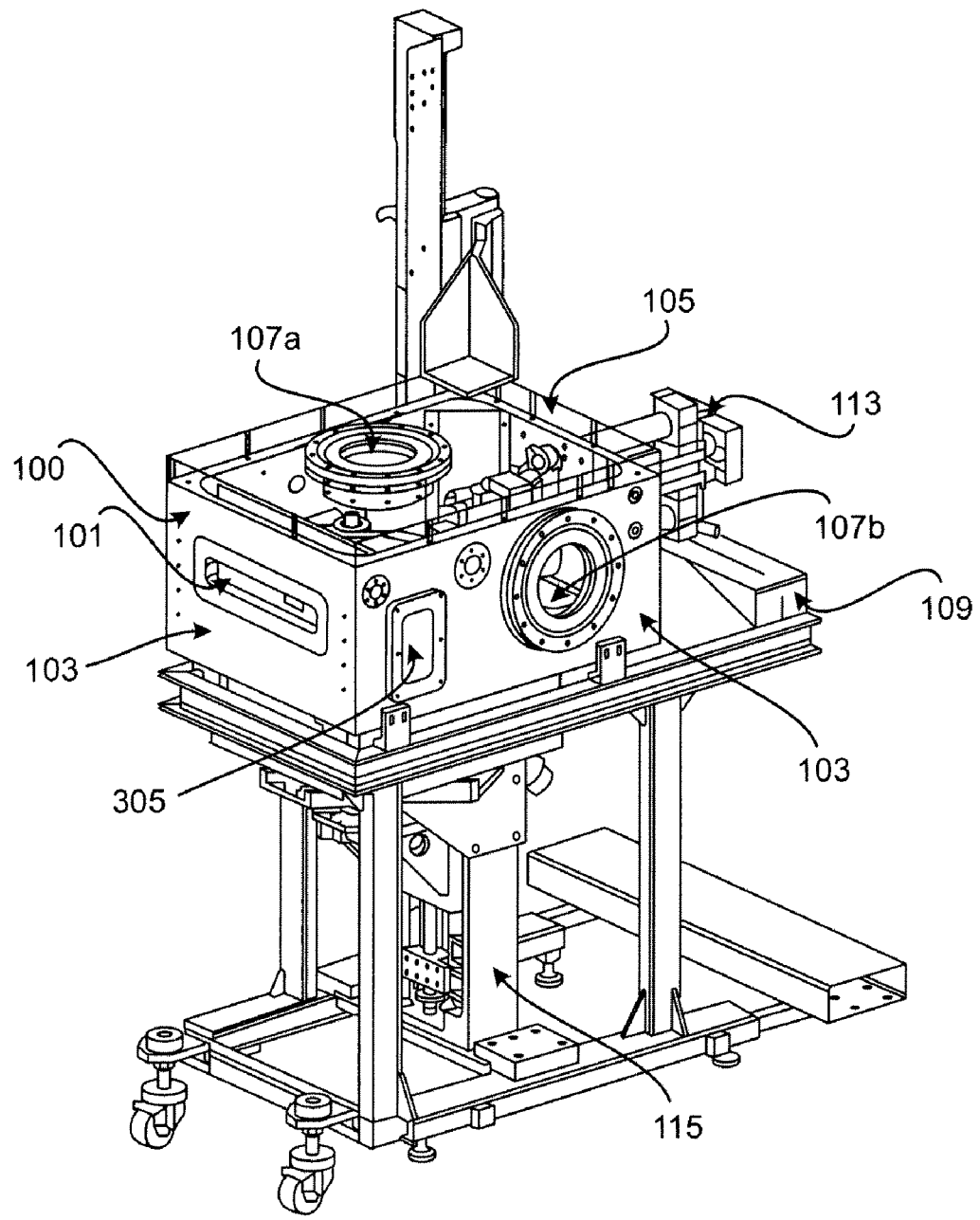
FIG. 1 is an illustration showing an isometric view of a dry-in/dry-out electroless plating chamber, in accordance with one embodiment of the present invention.

FIG. 1 is an illustration showing an isometric view of a dry-in/dry-out electroless plating chamber 100 ("chamber 100" hereafter), in accordance with one embodiment of the present invention. The chamber 100 is defined to receive a wafer in a dry state, perform an electroless plating process on the wafer, perform a rinsing process on the wafer, perform a drying process on the wafer, and provide the processed wafer in a dry state. The chamber 100 is capable of performing essentially any type of electroless plating process. For example, the chamber 100 is capable of performing an electroless Cu or Co plating process on the wafer. Additionally, the chamber 100 is configured to be integrated within a modular wafer processing system. For example, in one embodiment, the chamber 100 is connected with a managed atmospheric transfer module (MTM). For additional information regarding the MTM, reference can be made to U.S. patent application Ser. No. 11/639,752, filed on Dec. 15, 2006, and entitled "Controlled Ambient System for Interface Engineering," which is incorporated herein by reference.

For more information on electroless plating, reference can be made to: (1) U.S. patent application Ser. No. 11/382,906, filed on May 11, 2006, entitled "Plating Solution for Electroless Deposition of Copper," (2) U.S. patent application Ser. No. 11/427,266, filed on Jun. 28, 2006, entitled "Plating Solutions for Electroless Deposition of Copper," (3) U.S. patent application Ser. No. 11/639,012, filed on Dec. 13, 2006, entitled "Self Assembled Monolayer for Improving Adhesion Between Copper and Tantalum," (4) U.S. patent application Ser. No. 11/591,310, filed on Oct. 31, 2006, entitled "Methods of Fabricating a Barrier Layer with Varying Composition for Copper Metallization," (5) U.S. patent application Ser. No. 11/552,794, filed on Oct. 25, 2006, entitled "Apparatus and Method for Substrate Electroless Plating," (6) U.S. Pat. No. 7,153,400, entitled "Apparatus and Method for Depositing and Planarizing Thin Films of Semiconductor Wafers," (7) U.S. patent application Ser. No. 11/539,155, filed on Oct. 5, 2006, entitled "Electroless Plating Method and Apparatus," and (8) U.S. patent application Ser. No. 11/611,758, filed on Dec. 15, 2006, entitled "Method for Gap Fill in Controlled Ambient System," each of which is incorporated herein by reference.

The chamber 100 is equipped to receive a wafer in a dry state from an interfacing module, such as the MTM. The chamber 100 is equipped to perform an electroless plating process on the wafer within the chamber 100. The chamber 100 is defined to perform a drying process on the wafer within the chamber 100. The chamber 100 is defined to provide the wafer in a dry state back to the interfacing module. It should be appreciated that the chamber 100 is defined to perform the electroless plating process and the drying process on the wafer within a common internal volume of the chamber 100. Additionally, a fluid handling system (FHS) is provided to support the wafer electroless plating process and the wafer drying process within the common internal volume of the chamber 100.

The chamber 100 includes a first wafer processing zone defined within an upper region of an internal volume of the chamber 100. The first wafer processing zone is equipped to perform the drying process on the wafer when disposed within the first wafer processing zone. The chamber 100 also includes a second wafer processing zone defined within a lower region of the internal volume of the chamber 100. The second wafer processing zone is equipped to perform the electroless plating process on the wafer when disposed within the second wafer processing zone. Additionally, the chamber 100 includes a platen that is vertically movable between the first and second wafer processing zones within the internal volume of the chamber 100. The platen is defined to transport the wafer between the first and second processing zones and support the wafer within the second processing zone during the electroless plating process.

With regard to FIG. 1, the chamber 100 is defined by outer structure walls 103 including an outer structural bottom and a structural top 105. The outer structure of the chamber 100 is capable of resisting forces associated with a sub-atmospheric pressure, i.e., vacuum, condition within the internal volume of the chamber 100. The outer structure of the chamber 100 is also capable of resisting forces associated with an above-atmospheric pressure condition within the internal volume of the chamber 100. In one embodiment, the structural top 105 of the chamber is equipped with a window 107A. Additionally, in one embodiment a window 107B is provided in an outer structural wall 103 of the chamber. It should be understood, however, that the windows 107A and 107B are not critical to the operation of the chamber 100. For example, in one embodiment, the chamber 100 is defined without windows 107A and 107B.

The chamber 100 is defined to sit atop a frame assembly 109. It should be understood that other embodiments may utilize a frame assembly that is different from the exemplary frame assembly 109 depicted in FIG. 1. The chamber 100 is defined to include an entry door 101 through which a wafer is inserted into and removed from the chamber 100. The chamber 100 further includes a stabilizer assembly 305, a platen lift assembly 115, and a proximity head drive mechanism 113, each of which will be described in more detail below.

Figure 2:
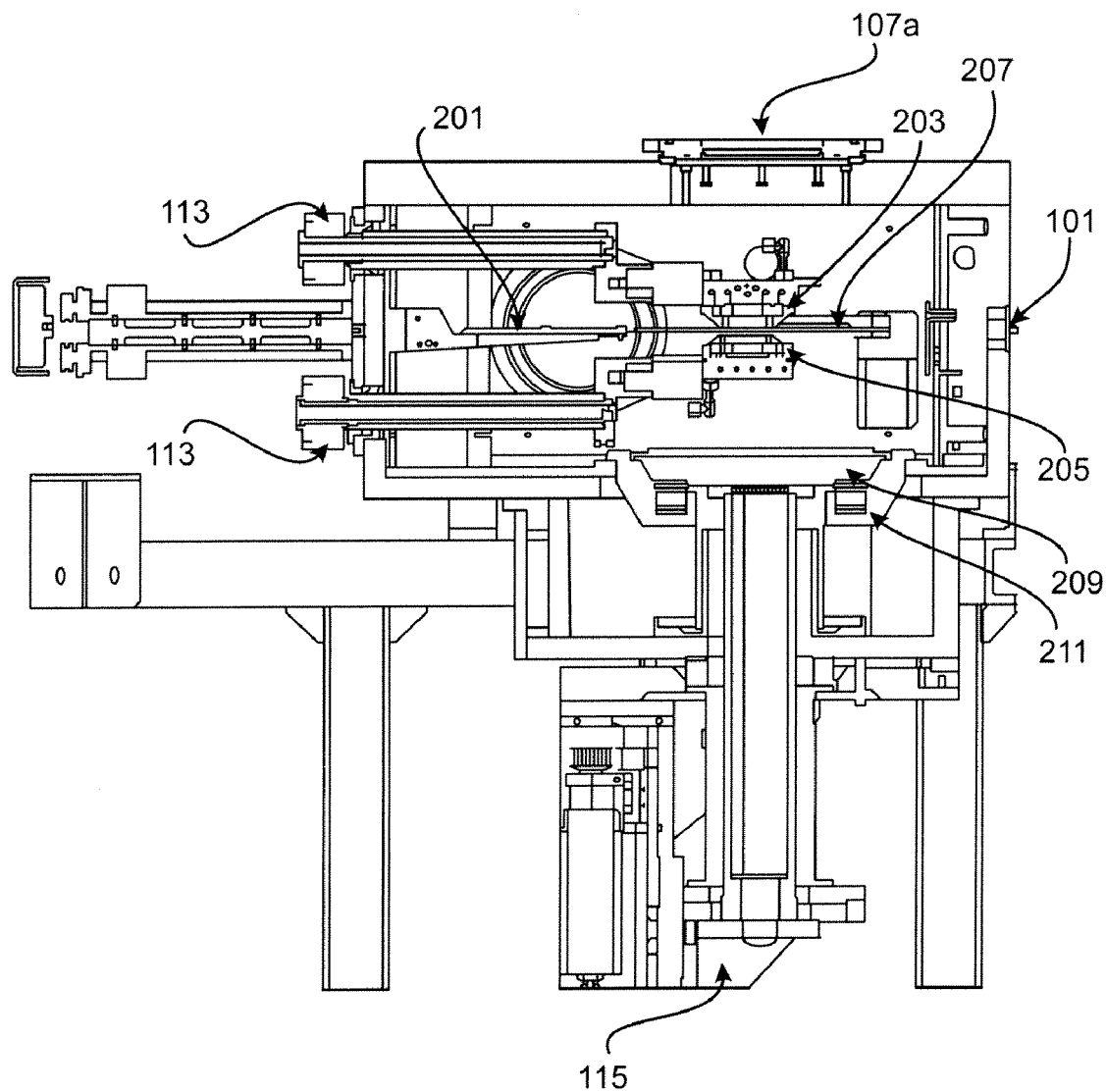
FIG. 2 is an illustration showing a vertical cross-section through a center of the chamber, in accordance with one embodiment of the present invention.

FIG. 2 is an illustration showing a vertical cross-section through a center of the chamber 100, in accordance with one embodiment of the present invention. The chamber 100 is defined such that when a wafer 207 is inserted through the entry door 101, the wafer 207 will be engaged by a drive roller assembly 303 (not shown) and the stabilizer assembly 305 within the upper region of the chamber internal volume. By way of the platen lift assembly 115, a platen 209 is defined to travel in a vertical direction between the upper and lower regions of the chamber internal volume. The platen 209 is defined to receive the wafer 207 from the drive roller assembly 303 and stabilizer assembly 305, and move the wafer 207 to the second wafer processing zone in the lower region of the chamber internal volume. As will be described in more detail below, within the lower region of the chamber, the platen 209 is defined to interface with a fluid bowl 211 to enable the electroless plating process.

Following the electroless plating process within the lower region of the chamber, the wafer 207 is lifted via the platen 209 and platen lift assembly 115 back to the position where it can be engaged by the drive roller assembly 303 and the stabilizer assembly 305. Once securely engaged by the drive roller assembly 303 and the stabilizer assembly 305, the platen 209 is lowered to a position within the lower region of the chamber 100. The wafer 207, having been subjected to the electroless plating process, is then dried by way of an upper proximity ("prox" hereafter) head 203 and a lower prox head 205. The upper prox head 203 is defined to dry an upper surface of the wafer 207. The lower prox head is defined to dry a lower surface of the wafer 207.

By way of the prox head drive mechanism 113, the upper and lower prox heads 203/205 are defined to move in a linear manner across the wafer 207 when the wafer 207 is engaged by the drive roller assembly 303 and the stabilizer assembly 305. In one embodiment, the upper and lower prox heads 203/205 are defined to move to a center of the wafer 207 as the wafer 207 is rotated by the drive roller assembly 303. In this manner, the wafer 207 upper and lower surfaces can be completely exposed to the upper and lower prox heads 203/205, respectively. The chamber 100 further includes a prox head docking station 201 for receiving each of the upper and lower prox heads 203/205 when retracted to their home position. The prox head docking station 201 also provides for a smooth transition of the meniscus associated with each of the upper and lower prox heads 203/205 as the meniscus transitions onto the wafer 207. The prox head docking station 201 is positioned within the chamber so as to ensure that when the upper and lower prox heads 203/205 are retracted to their respective home positions, the upper and lower prox heads 203/205 do not interfere with the drive roller assembly 303, the stabilizer assembly 305, or the platen 209 when raised to receive the wafer 207.

Figure 3:
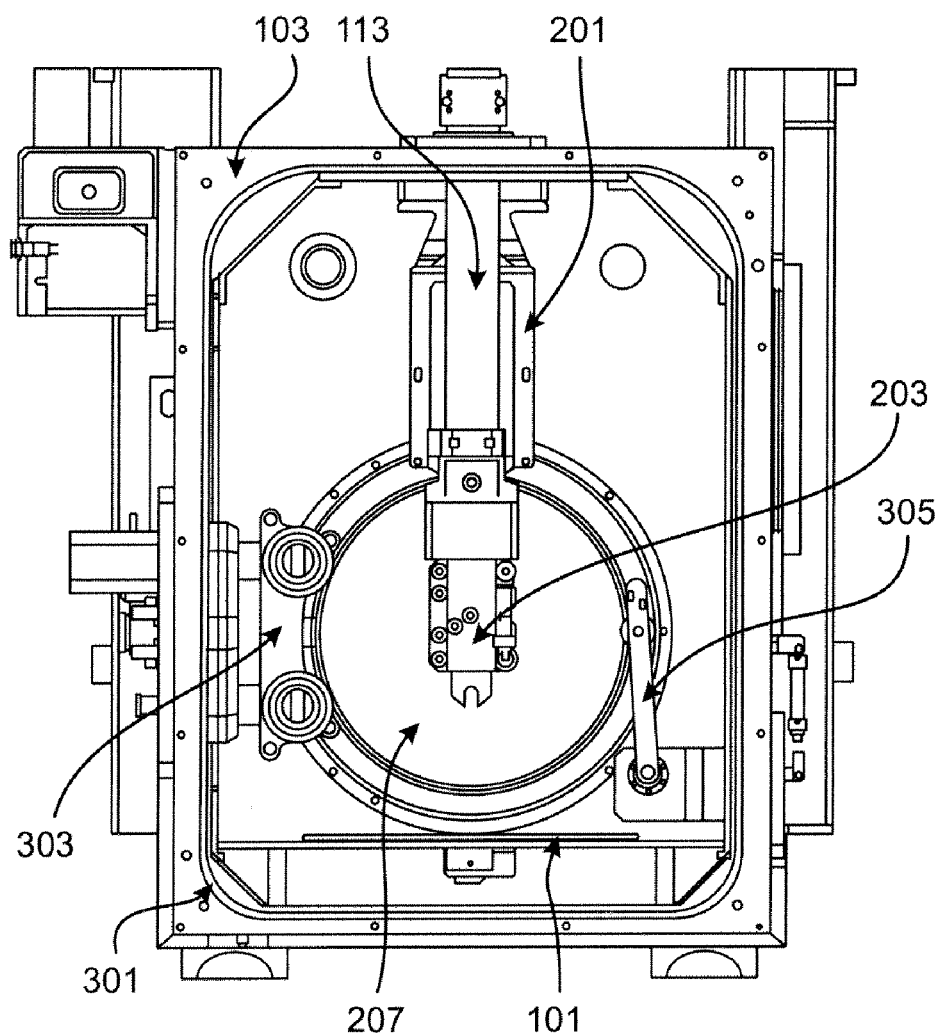
FIG. 3 is an illustration showing a top view of the chamber with the upper prox head extended to the center of the wafer, in accordance with one embodiment of the present invention.
Figure 4:
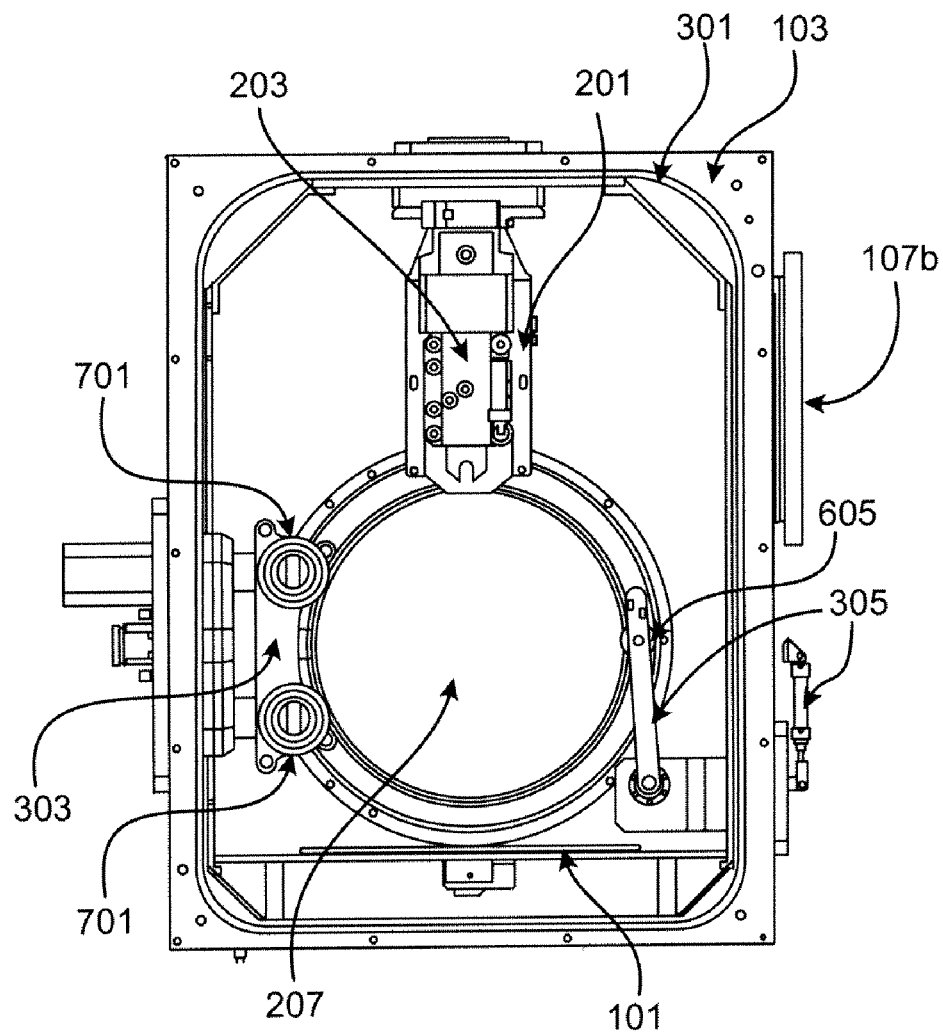
FIG. 4 is an illustration showing a top view of the chamber with the upper prox head retracted to the home position over the prox head docking station, in accordance with one embodiment of the present invention.

FIG. 3 is an illustration showing a top view of the chamber with the upper prox head 203 extended to the center of the wafer 207, in accordance with one embodiment of the present invention. FIG. 4 is an illustration showing a top view of the chamber with the upper prox head 203 retracted to the home position over the prox head docking station 201, in accordance with one embodiment of the present invention. As previously mentioned, when the wafer 207 is received within the chamber 100 through the entry door 101, the wafer is engaged and held by the drive roller assembly 303 and the stabilizer assembly 305. By way of the prox head drive mechanism 113, the upper prox head 203 can be moved in a linear manner from its home position on the prox head docking station 201 to the center of the wafer 207. Similarly, by way of the prox head drive mechanism 113, the lower prox head 205 can be moved in a linear manner from its home position on the prox head docking station 201 to the center of the wafer 207. In one embodiment, the prox head drive mechanism 113 is defined to move the upper and lower prox heads 203/205 together from the prox head docking station 201 to the center of the wafer 207.

As shown in FIG. 3, the chamber 100 is defined by the outer structural walls 103 and an inner liner 301. Thus, the chamber 100 incorporates a double-wall system. The outer structural walls 103 have sufficient strength to provide a vacuum capability within the chamber 100 and thereby form a vacuum boundary. In one embodiment, the outer structural walls 103 are formed of a structural metal such as stainless steel. It should be understood, however, that essentially any other structural material having appropriate strength characteristics can be used to form the outer structural walls 103. The outer structural walls 103 are also defined with sufficient precision to enable interfacing of the chamber 100 with another module, such as the MTM.

The inner liner 301 provides a chemical boundary and acts as a separator to keep chemicals within the chamber from reaching the outer structural walls 103. The inner liner 301 is formed of an inert material that is chemically compatible with the various chemicals that may be present within the chamber 100. In one embodiment, the inner liner 301 is formed of an inert plastic material. It should be understood, however, that essentially any other chemically inert material that can be appropriately shaped can be used to form the inner liner 301. It should also be understood that the inner liner 301 is not required to provide a vacuum boundary. As previously mentioned, the outer structural walls 103 are defined to provide the vacuum boundary. Additionally, in one embodiment, the inner liner 301 can be removed from the chamber 100 to facilitate cleaning or to simply be replaced with a new inner liner 301.

The chamber 100 is defined to be ambient controlled to facilitate the wafer electroless plating process and protect the wafer surface from undesirable reactions, e.g., oxidation. To this end, the chamber 100 is equipped with an internal pressure control system and an internal oxygen content control system. The chamber 100 internal pressure is capable of being reduced by way of a vacuum source plumbed to the internal volume of the chamber 100. The chamber 100 internal pressure is controlled through use of a pressure controller, such as a Universal Pressure Controller (UPC). The UPC is defined to read the chamber 100 internal pressure as measured by a pressure sensor, and maintain the chamber 100 internal pressure at a setpoint by allowing more of an inert gas, such as nitrogen, into the chamber 100 internal volume. It should be understood that the UPC does not actually reduce the pressure within the chamber 100 internal volume, as the vacuum system is provided for pressure reduction purposes. Additionally, it should be understood that the pressure controller can be something other than the UPC, so long as the pressure controller functionality is substantially equivalent to that of the UPC. However, for ease of description, the pressure controller is referred to as the UPC hereafter.

The chamber 100 is also equipped with a slow-pump valve, i.e., a bleed-through valve, to allow a small amount of the chamber 100 internal atmosphere to be removed. The amount of chamber 100 internal atmosphere removed by way of the slow-pump valve is replaced by the UPC so that the chamber 100 internal pressure remains at setpoint. In one embodiment, the chamber 100 is capable of being pumped down to less than 100 mTorr. In one embodiment, it is anticipated that the chamber 100 will be operated at approximately 700 Torr. Additionally, the chamber 100 is equipped with a pressure switch plumbed to the internal volume of the chamber 100. The pressure switch indicates when the pressure within the chamber 100 is at a pressure level below atmospheric pressure (760 Torr) but above 500 Torr. In one embodiment, the pressure switch can be set to open when the chamber 100 internal pressure is below 500 Torr.

The chamber 100 is further defined to enable control of an oxygen content within the chamber 100 internal volume. It should be appreciated that the oxygen concentration within the chamber 100 internal volume is an important process parameter. More specifically, a low oxygen concentration is required in the wafer processing environment to ensure that undesirable oxidation reactions are avoided at the wafer surface. It is anticipated that the oxygen concentration within the chamber 100 internal volume will be maintained at a level less than 2 ppm (parts per million) when the wafer is present within the chamber 100.

The oxygen concentration within the chamber 100 is reduced by evacuating the chamber, by way of a vacuum source plumbed to the internal volume of the chamber 100, and refilling the chamber 100 internal volume with high purity nitrogen. Therefore, the oxygen concentration within the chamber 100 internal volume is reduced from atmospheric levels, i.e., about 20% oxygen, by pumping the chamber 100 internal volume down to a low pressure and refilling the chamber 100 internal volume with ultra pure nitrogen which has a negligible oxygen content. In one embodiment, pumping the chamber 100 internal volume down to 1 Torr and refilling it to atmospheric pressure with ultra pure nitrogen three times should bring the oxygen concentration within the chamber 100 internal volume down to about 3 ppm.

To assist with maintaining the oxygen concentration at an appropriate level within the chamber 100 internal volume, an oxygen sensor is mounted to a port on the chamber 100. In one embodiment, the oxygen sensor is a zirconium oxide based sensor that is defined to output an electric current that is indicative of the oxygen concentration within a gas to which the sensor is exposed. The oxygen sensor is calibrated for a given pressure and a given flow rate of gas traveling past the sensor. In one embodiment, the oxygen sensor is calibrated to have an accuracy extending from about +/−0.1 ppm to about +/−5 ppm of oxygen.

The electroless plating process is a temperature sensitive process. Therefore, it is desirable to minimize the influence of the chamber 100 internal volume ambient conditions on the temperature of the electroless plating solution when present on the wafer surface. To this end, the chamber 100 is defined such that gases can be introduced into the chamber 100 internal volume through air gaps present between the outer structural walls 103 and the inner liner 301, so as to avoid flowing of gases directly over the wafer. It should be appreciated that a flow of gas directly over the wafer when electroless plating solution is present on the wafer surface could cause an evaporative cooling effect that would reduce the temperature of the electroless plating solution present on the wafer, and correspondingly modify the electroless plating reaction rate. In addition to the capability of indirectly introducing gas into the chamber 100 internal volume, the chamber 100 is also equipped to allow a vapor pressure within the chamber 100 internal volume to be raised to a saturated state when the electroless plating solution is applied over the wafer surface. With the chamber 100 internal volume in a saturated state relative to the electroless plating solution, the above-mentioned evaporative cooling effect would be minimized.

Figure 5:
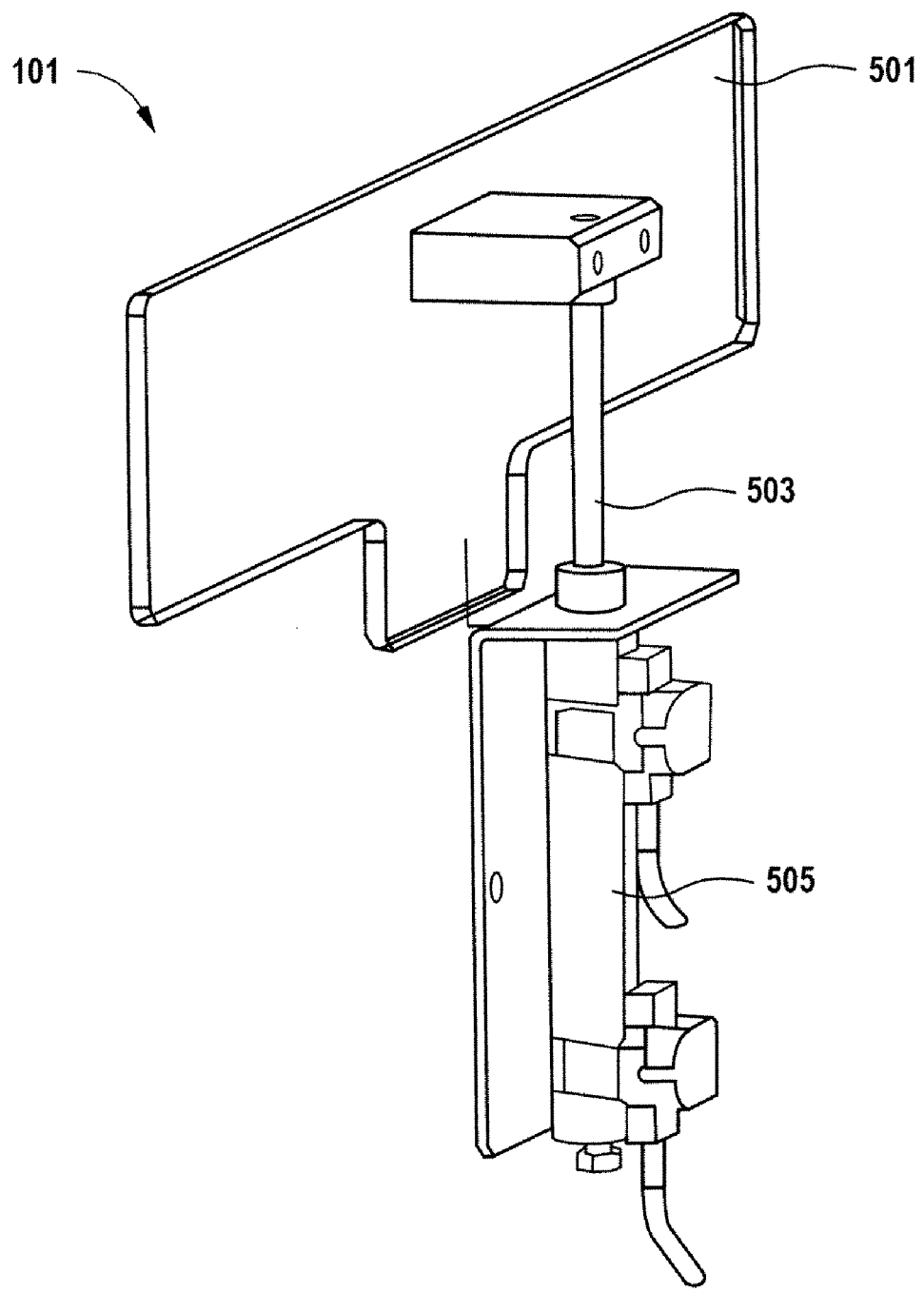
FIG. 5 is an illustration showing an isometric view of the entry door, in accordance with one embodiment of the present invention.

FIG. 5 is an illustration showing an isometric view of the entry door 101, in accordance with one embodiment of the present invention. The entry door 101 is a shutter type door that shields a chamber entry rocker valve and outer module, e.g., MTM, from the chamber 100. The entry door 101 assembly includes a shutter 501 which is movable in a vertical direction to cover the chamber entry rocker valve. An actuator 505 and linkage 503 are provided with the entry door 101 assembly to enable the vertical movement of the shutter 501. In one embodiment, the actuator 505 is defined as a pneumatic cylinder. Although the entry door 101 is exemplified herein as a shutter type door, it should be appreciated that in other embodiments the chamber 100 can be defined to incorporate other types of entry doors, so long as the entry door 101 achieves its objective of shielding the entry rocker valve and outer module from the chamber 100 internal region.

Figure 6:
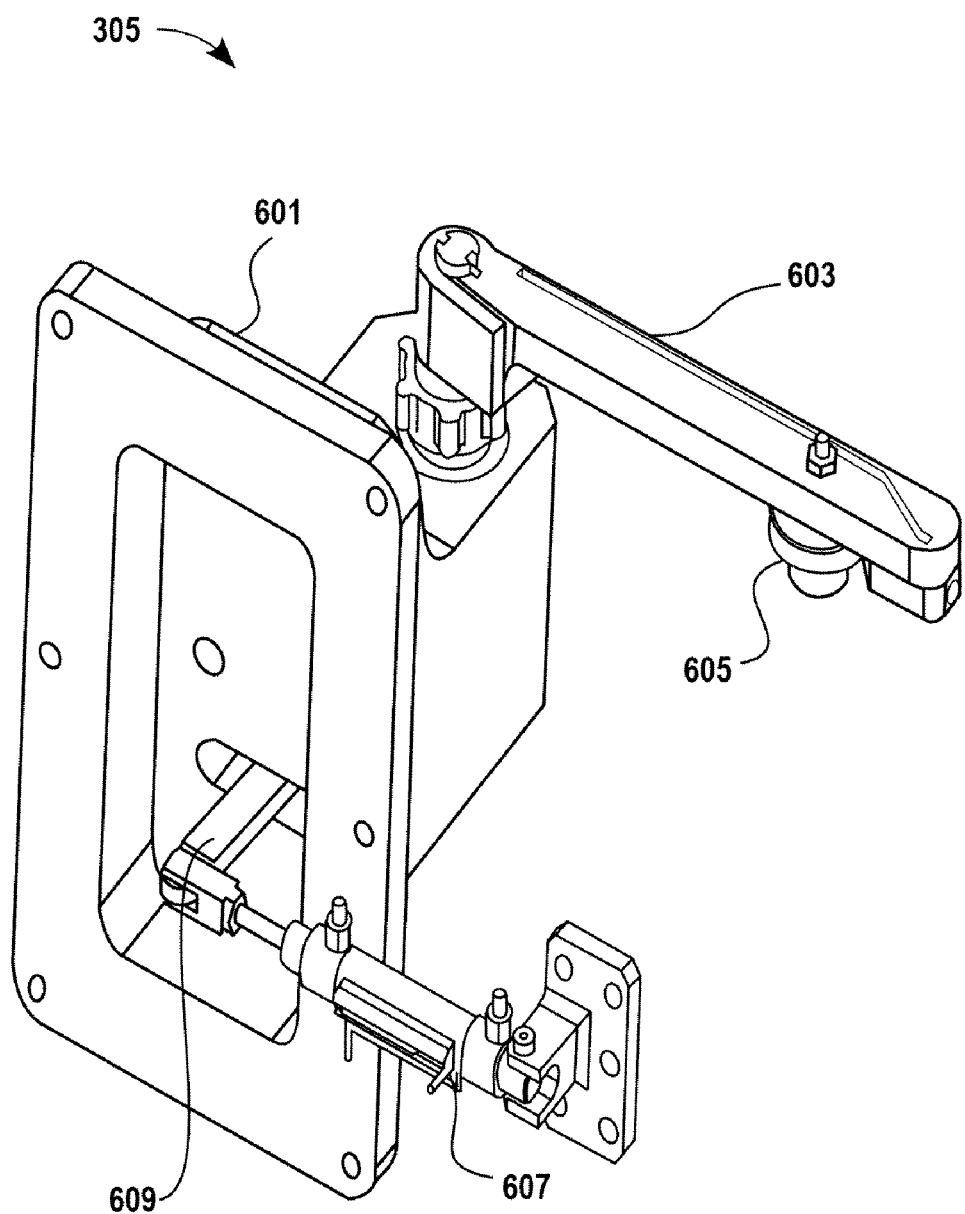
FIG. 6 is an illustration showing an isometric view of the stabilizer assembly, in accordance with one embodiment of the present invention.

FIG. 6 is an illustration showing an isometric view of the stabilizer assembly 305, in accordance with one embodiment of the present invention. The stabilizer assembly 305 includes a stabilizer roller 605 that is defined to apply pressure to the edge of the wafer 207 so as to hold the wafer 207 in the drive roller assembly 303. Thus, the stabilizer roller 605 is defined to engage the edge of the wafer 207. The stabilizer roller 605 profile is defined to accommodate an amount of angular misalignment between the stabilizer roller 605 and the wafer 207. Also, the stabilizer assembly 305 is defined to enable mechanical adjustment of the stabilizer roller 605 vertical position. The stabilizer assembly 305 shown in FIG. 6 includes a single stabilizer roller 605 to accommodate a 200 mm wafer. In another embodiment, the stabilizer assembly 305 can be defined with two stabilizer rollers 605 to accommodate a 300 mm wafer.

The stabilizer roller 605 is defined on a stabilizer bar 603 to enable movement of the stabilizer roller 605 toward and away from the edge of the wafer 207. An actuator 607, such as a pneumatic cylinder, is provided along with appropriate linkage 609 to enable movement of the stabilizer bar 603, so as to engage the stabilizer roller 605 with the wafer 207 edge and disengage the stabilizer roller 605 from the wafer 207 edge. The stabilizer assembly 305 further includes a housing 601 defined to enable connection of the stabilizer assembly to the chamber 100, and provide a support frame for the stabilizer bar 603. In one embodiment, sensors are deployed within the chamber 100 to enable identification of the position of the stabilizer roller 605 with respect to the wafer 207 edge. For example, in one embodiment, Hall Effect type sensors are deployed to enable identification of the stabilizer roller 605 as being either disengaged from the wafer 207, engaged with the wafer 207, or overshooting the wafer 207 engagement position (such as when the wafer 207 is not present). Additionally, in one embodiment, a vacuum drying device is mounted to the stabilizer bar 603 to provide for drying of the stabilizer roller 605, which may be wet due to contact with the wafer 207 prior to the wafer 207 drying process.

Figure 7:
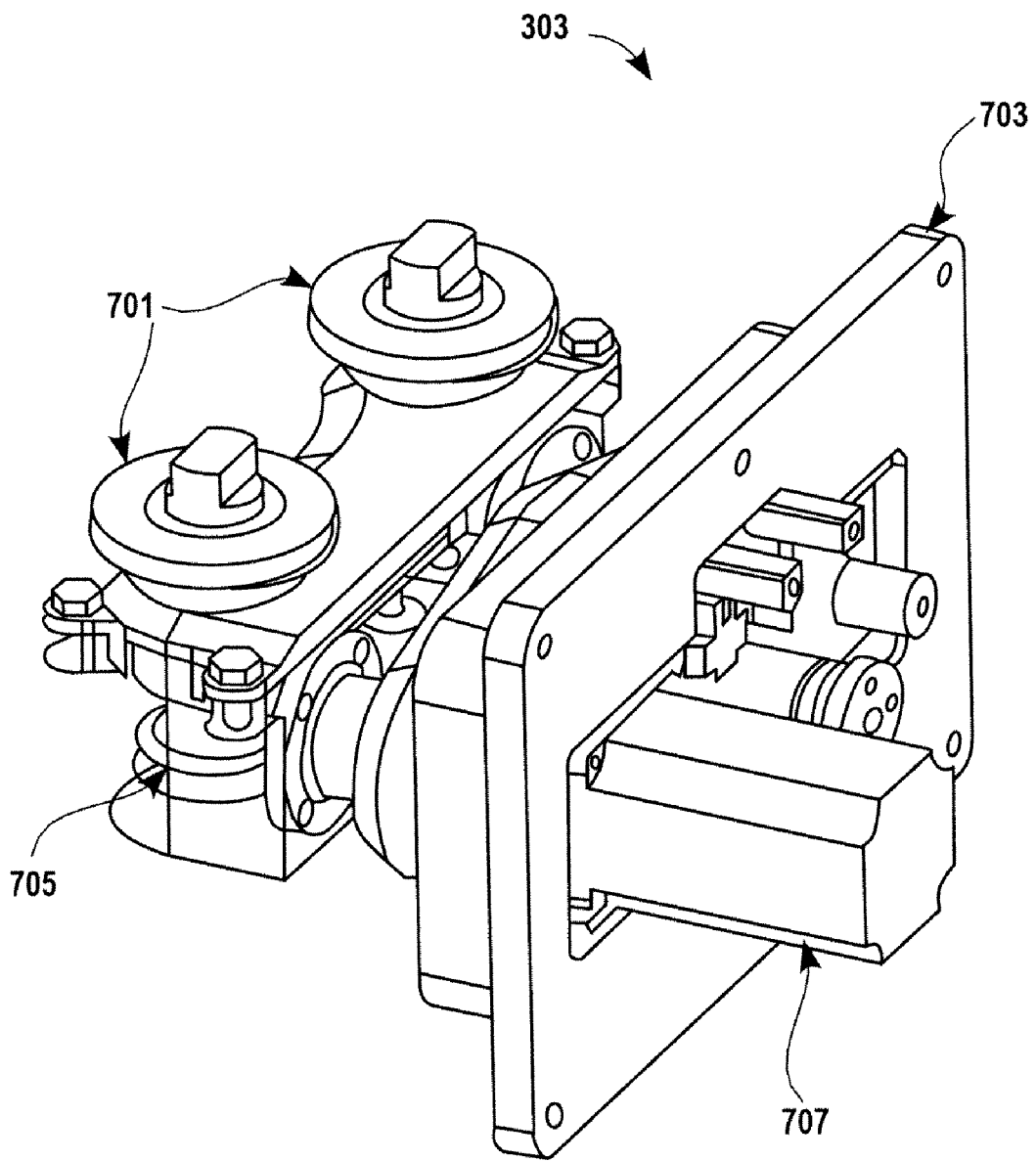
FIG. 7 is an illustration showing the drive roller assembly, in accordance with one embodiment of the present invention.

FIG. 7 is an illustration showing the drive roller assembly 303, in accordance with one embodiment of the present invention. The drive roller assembly 303 includes a pair of drive rollers 701 defined to engage the edge of the wafer 207 and rotate the wafer 207. In one embodiment, the drive rollers 701 are rotated in a common direction and at a common rotational speed by drive mechanics 705. Each of the drive rollers 701 is defined to engage the edge of the wafer 207. The profile of each drive roller 701 is defined to accommodate an amount of angular misalignment between the drive roller 701 and the wafer 207. Also, the drive roller assembly 303 is defined to enable mechanical adjustment of the vertical position of each drive roller 701.

The drive roller assembly 303 includes an extension mechanism 707 to enable movement of the drive rollers 701 toward and away from the edge of the wafer 207. In one embodiment, a pneumatic actuator is used to move the extension mechanism 707 to enable movement of the drive rollers 701 toward and away from the edge of the wafer 207. When the drive rollers 701 are moved to their limit toward the wafer 207 edge, the drive rollers 207 will come to a position just shy of the wafer 207 edge, when the wafer 207 is in the robot handoff position within the chamber 100. Engagement of the stabilizer roller 605 with the edge of the wafer 207 will cause the drive rollers 701 to engage the edge of the wafer 207.

The drive roller assembly 303 further includes a housing 703 defined to enable connection of the drive roller assembly 303 to the chamber 100, and provide a support frame for the drive mechanics 705, extension mechanism 707, and drive rollers 701. In one embodiment, sensors are deployed within the chamber 100 to enable identification of the position of the drive rollers 701 with respect to the wafer 207 edge. For example, in one embodiment, optical beam break type sensors are deployed to enable identification of the position of the drive roller assembly 303 with respect to the wafer 207, i.e., closed (drive roller assembly 303 move to its limit toward the wafer 207, or open (drive roller assembly 303 fully retracted away from the wafer 207). Additionally, in one embodiment, a vacuum drying device is mounted to the drive roller assembly 303 to provide for drying of the drive rollers 701, which may be wet due to contact with the wafer 207 prior to the wafer 207 drying process.

Figure 8:
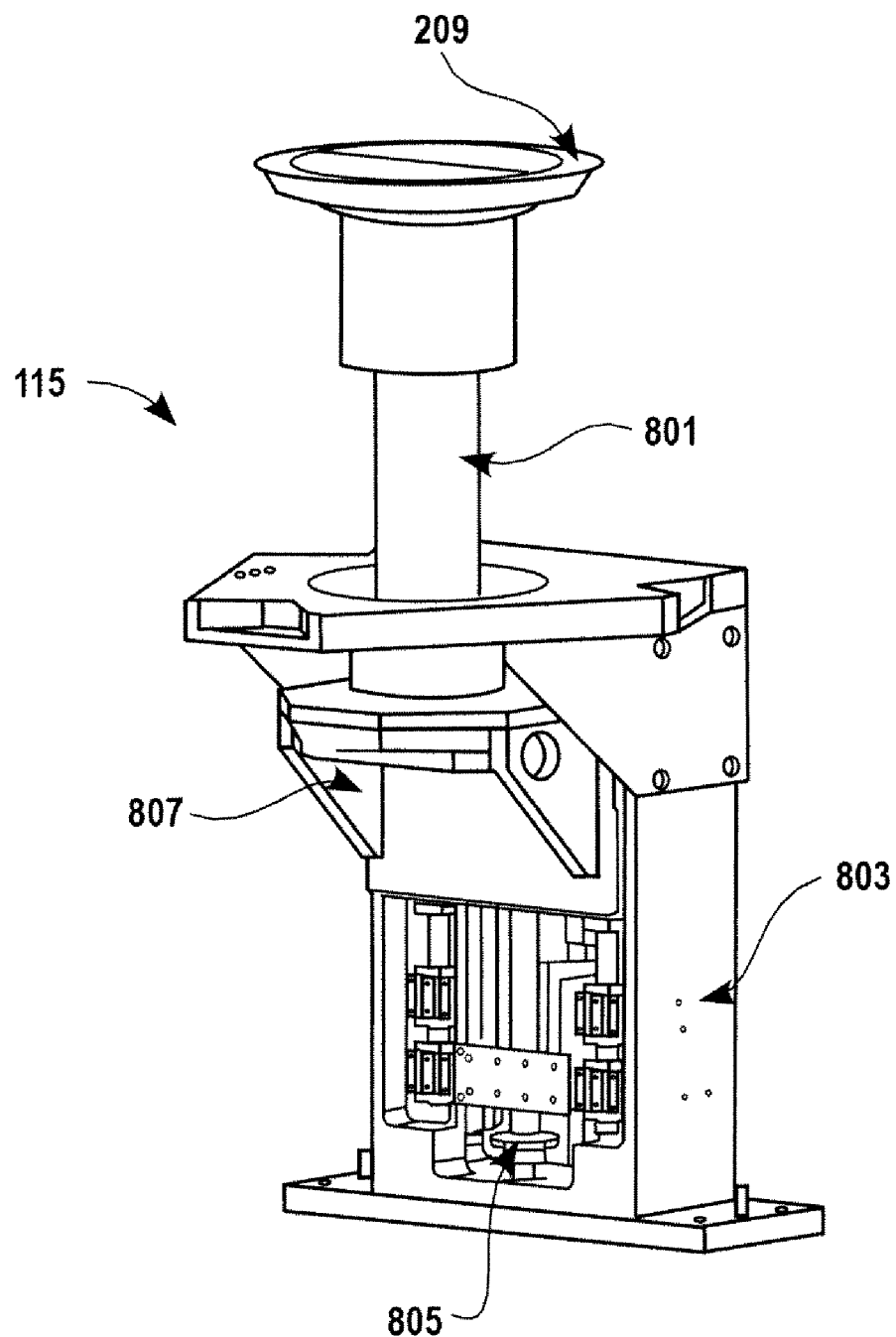
FIG. 8 is an illustration showing an isometric view of the platen lift assembly, in accordance with one embodiment of the present invention.

FIG. 8 is an illustration showing an isometric view of the platen lift assembly 115, in accordance with one embodiment of the present invention. The platen lift assembly 115 includes a shaft 801 upon which the platen 209 is mounted. A lower end of the shaft 801 is fixed to a lift frame 807. The lift frame 807 is defined to move in a vertical direction so as to move the shaft 801 and platen 209 in a vertical direction. In one embodiment, the platen lift assembly 115 includes a linear encoder to provide platen 209 position feedback. Movement of the platen 209 is controlled through a control module that receives signals from the linear encoder indicating the position of the platen 209. The platen lift assembly 115 is defined to move the wafer 207 on the platen 209 from the wafer rotation plane, i.e., the plane where the wafer is engaged by the drive rollers 701 and stabilizer roller 605, to the processing position where the platen 209 engages a seal of the fluid bowl 211.

Lift mechanics 805 are provided to enable the vertical movement of the lift frame 807, shaft 801, and platen 209. In various embodiments, the lift mechanics 805 can incorporate electrical motors and/or pneumatic actuators, and appropriate gearing and linkage to provide vertical movement to the lift frame 807, shaft 801, and platen 209. In one embodiment, a DC servo motor is provided to rotate a leadscrew which drives the lift frame 807 up and down, thus driving the platen 209 up and down within the chamber via the shaft 801. Also, in one embodiment, a pneumatic assembly is provided to assist the lift of the platen 209 in its initial movement against a suction vacuum between the platen 209 and a seal of the fluid bowl 211. The platen lift assembly 115 also includes a support frame 803 which provides stable support structure for the lift frame 807 and lift mechanics 805. The support frame 803 is defined to interface with a lower surface of the chamber 100, such that the platen lift assembly 115 will provide for vertical movement of the platen 209 within the chamber 100 internal volume.

Figure 9:
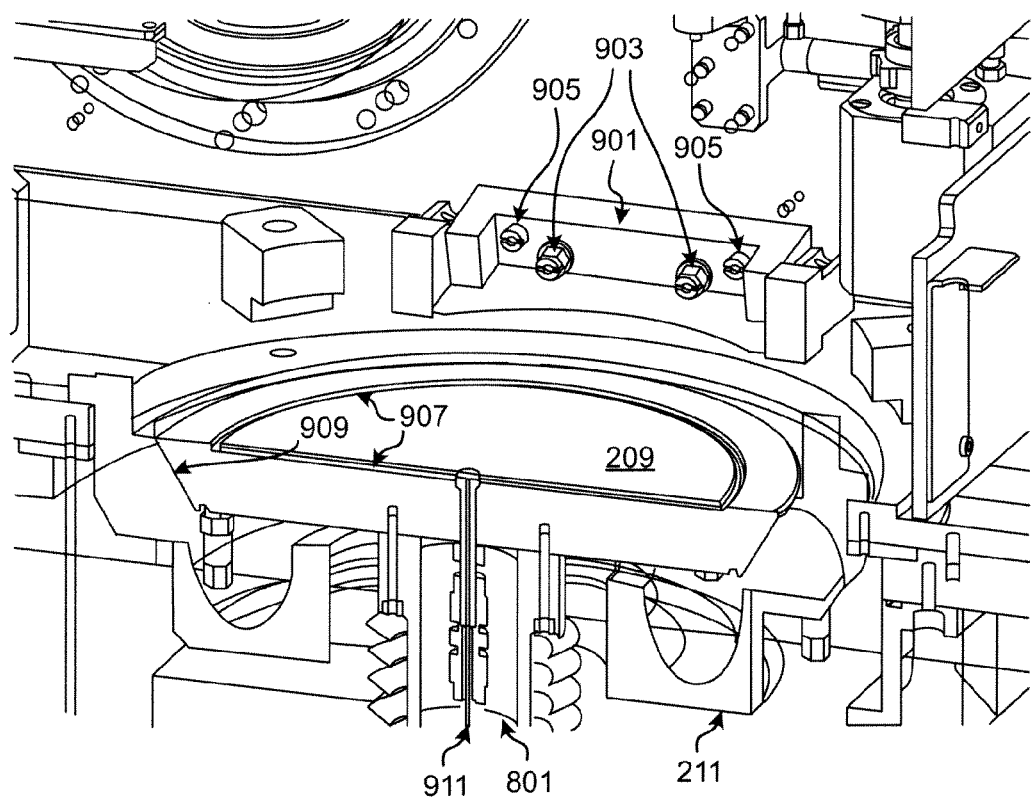
FIG. 9 is an illustration showing a vertical cross-section through the platen and fluid bowl with the platen in a fully lowered position, in accordance with one embodiment of the present invention.

FIG. 9 is an illustration showing a vertical cross-section through the platen 209 and fluid bowl 211 with the platen 209 in a fully lowered position, in accordance with one embodiment of the present invention. The platen 209 is defined as a heated vacuum chuck. In one embodiment, the platen 209 is fabricated from a chemically inert material. In another embodiment, the platen 209 is coated with a chemically inert material. The platen 209 includes vacuum channels 907 connected to a vacuum supply 911, which upon actuation will vacuum clamp the wafer 207 to the platen 209. Vacuum clamping of the wafer 207 to the platen 209 decreases a thermal resistance between the platen 209 and the wafer 207 and also prevents the wafer 207 from sliding during vertical transport within the chamber 100.

In various embodiments, the platen 209 can be defined to accommodate a 200 mm wafer or a 300 mm wafer. Additionally, it should be appreciated that the platen 209 and chamber 100 can be defined to accommodate essentially any size wafer. For a given wafer size, a diameter of the platen 209 upper surface, i.e., clamping surface, is defined to be slightly less than a diameter of the wafer. This platen-to-wafer sizing arrangement enables the edge of the wafer to extend slightly beyond the upper peripheral edge of the platen 209, thus enabling engagement between the wafer edge and each of the stabilizer roller 605 and drive rollers 701 when the wafer is sitting upon the platen 209.

As previously mentioned, the electroless plating process is a temperature sensitive process. The platen 209 is defined to be heated so that the temperature of the wafer 207 can be controlled. In one embodiment, the platen 209 is capable of maintaining a temperature up to 100° C. Also, the platen 209 is capable of maintaining a temperature as low as 0° C. It is anticipated that a normal platen 209 operating temperature will be about 60° C. In the embodiment where the platen 209 is sized to accommodate a 300 mm wafer, the platen 209 is defined with two interior resistive heating coils so as to form an inner heating zone and an outer heating zone, respectively. Each heating zone includes its own control thermocouple. In one embodiment, the inner heating zone utilizes a 700 Watt (W) resistive heating coil, and the outer zone utilizes a 2000 W resistive heating coil. In the embodiment where the platen 209 is sized to accommodate a 200 mm wafer, the platen 209 includes a single heating zone defined by a 1250 W interior heating coil and corresponding control thermocouple.

The fluid bowl 211 is defined to receive the platen 209 when the platen 209 is fully lowered within the chamber 100. The fluid holding capability of the fluid bowl 211 is completed when the platen 209 is lowered to engage a fluid bowl seal 909 defined about an inner periphery of the fluid bowl 211. In one embodiment, the fluid bowl seal 909 is an energized seal which forms a liquid tight seal between the platen 290 and fluid bowl 211, when the platen 209 is lowered to fully contact the fluid bowl seal 909. It should be appreciated that when the platen 209 is lowered to engage the fluid bowl seal 909, a gap exists between the platen 209 and the fluid bowl 211. Thus, engagement of the platen 209 with the fluid bowl seal 909 allows an electroplating solution to be injected into the bowl so as to fill the gap that exists between the platen 209 and the fluid bowl 211 above the fluid bowl seal 909, and well-up over the periphery of the wafer 207 that is clamped on the upper surface of the platen 209.

In one embodiment, the fluid bowl 211 includes eight fluid dispense nozzles for dispensing of the electroplating solution within the fluid bowl 211. The fluid dispense nozzles are distributed in a uniformly spaced manner around the fluid bowl 211. Each of the fluid dispense nozzles is fed by a tube from a distribution manifold such that a fluid dispense rate from each fluid dispense nozzle is substantially the same. Also, the fluid dispense nozzles are disposed such that fluid emanating from each of the fluid dispense nozzles enters the fluid bowl 211 at a location below the upper surface of the platen 209, i.e., below the wafer 207 that is clamped on the upper surface of the platen 209. Additionally, when the platen 209 and wafer 207 are not present in the fluid bowl 211, the fluid bowl 211 can be cleaned by injecting a cleaning solution into the fluid bowl 211 through the fluid dispense nozzles. The fluid bowl 211 can be cleaned at a user defined frequency. For example, the fluid bowl can be cleaned as frequently as after processing of every wafer, or as infrequently as once every 100 wafers.

The chamber 100 also includes a rinse bar 901, which includes a number of rinse nozzles 903 and a number of blowdown nozzles 905. The rinse nozzles 903 are directed to spray rinse fluid on the top surface of the wafer 207 when the platen 209 is moved to place the wafer 207 in rinse position. At the rinse position, a space will exist between the platen 209 and the fluid bowl seal 909 to enable flow of rinse fluid into the fluid bowl 211 from which it can be drained. In one embodiment, two rinse nozzles 903 are provided for rinsing a 300 mm wafer, and one rinse nozzle 903 is provided for rinsing a 200 mm wafer. The blowdown nozzles 905 are defined to direct an inert gas, such as nitrogen, toward the top surface of the wafer to assist in removing fluid from the top surface of the wafer during the rinsing process. It should be appreciated that because the electroless plating reactions continuously occur when the electroless plating solution is in contact with the wafer surface, it is necessary to promptly and uniformly remove the electroless plating solution from the wafer upon completion of the electroless plating period. To this end, the rinse nozzles 903 and blowdown nozzles 905 enable prompt and uniform removal of the electroless plating solution from the wafer 207.

Operations of the chamber 100 are supported by a fluid handling system (FHS). In one embodiment, the FHS is defined as a separate module from the chamber 100 and is connected in fluid communication with various components within the chamber 100. The FHS is defined to service the electroless plating process, i.e., the fluid bowl dispense nozzles, rinse nozzles, and blowdown nozzles. The FHS is also defined to service the upper and lower prox heads 203/205. A mixing manifold is disposed between the FHS and the supply line that services each of the fluid dispense nozzles within the fluid bowl 211. Thus, the electroless plating solution that flows to each of the fluid dispense nozzles within the fluid bowl 211 is pre-mixed prior to reaching the fluid bowl 211.

Fluid supply lines are disposed to fluidly connect the mixing manifold to the various fluid dispense nozzles within the fluid bowl 211, such that the electroplating solution will flow into the fluid bowl 211 from each fluid dispense nozzle in a substantially uniform manner, e.g., at a substantially uniform flow rate. The FHS is defined to enable a nitrogen purge of the fluid supply lines disposed between the mixing manifold and the fluid dispense nozzles within the fluid bowl 211, so as to enable clearing of the fluid supply lines of electroplating solution. The FHS is also defined to support the wafer rinsing process by providing rinsing fluid to each of the rinse nozzles 903 and by providing inert gas to each of the blowdown nozzles 905. The FHS is defined to enable manual setting of a pressure regulator to control the liquid pressure emanating from the rinse nozzles 903.

The chamber 100 includes a number of fluid drain locations. In one embodiment, three separate fluid drain locations are provided within the chamber 100: 1) a primary drain from the fluid bowl 211, 2) a chamber floor drain, and 3) a platen vacuum tank drain. Each of these drains is connected to a common facility drain provided within the FHS. The fluid bowl 211 drain is plumbed from the fluid bowl 211 to a chamber drain tank. A valve is provided to control the draining of fluid from the fluid bowl 211 to the chamber drain tank. This valve is configured to open when fluid is present within the drain line extending from the fluid bowl 211 to the chamber drain tank.

The chamber floor drain is also plumbed to the chamber drain tank. In the event of a liquid spill within the chamber, liquid will drain from a port in the chamber floor, i.e., the chamber floor drain, to the chamber drain tank. A valve is provided to control the draining of fluid from the chamber floor to the chamber drain tank. This valve is configured to open when fluid is present within the drain line extending from the chamber floor to the chamber drain tank.

The vacuum supply 911 of the platen 209 is provided by a platen vacuum tank. The platen vacuum tank is equipped with its own drain tank, i.e., the platen drain tank. The platen drain tank also serves as a vacuum tank. A vacuum generator is connected to the platen drain tank and is the source of the backside wafer vacuum provided by way of the vacuum supply 911. Valves are provided to control the vacuum within the vacuum channels 907 of the platen 209, i.e., the vacuum present at the backside of the wafer 207. Sensors are also provided to monitor the vacuum pressure present at the backside of the wafer 207. In one embodiment, the platen drain tank and chamber drain tank share a common drain pump. However, each of the platen drain tank and chamber drain tank has its own isolation valve between the tank and the pump to enable emptying of each tank independently.

The chamber 100 is operated to accept a wafer 207 from an exterior module, e.g., MTM, to which the chamber 100 is connected. The wafer 207 is received by the drive rollers 701 and stabilizer roller 605 at a wafer handoff position in the upper region of the chamber 100. Prior to opening the chamber 100 to receive the wafer 207, a verification is made that the pressure within the chamber 100 is sufficiently close to the pressure within the external module to which the chamber 100 internal volume will be exposed when the chamber 100 is opened to receive the wafer 207. In one embodiment, a sufficiently close pressure within the chamber 100 is within +/−10 Torr of the external module pressure. Also, prior to opening the chamber 100 to receive the wafer 207, a verification is made that the oxygen content within the chamber 100 is sufficiently close to the oxygen content within the external module to which the chamber 100 internal volume will be exposed when the chamber 100 is opened to receive the wafer 207. In one embodiment, a sufficiently close oxygen content within the chamber 100 is within +/−5 ppm of the external module oxygen content.

Following receipt of the wafer 207 within the chamber 100, the wafer 207 is moved to the fluid bowl 211 in the lower region of the chamber 100 for the electroless plating process. The platen 209 is heated to a user specified temperature, and the wafer 207 is held on the platen 209 for a user specified duration to allow the wafer 207 to heat up. Then, the platen 209 is lowered to engage the fluid bowl seal 909, so as to cause an electroless plating solution that is flowing into the fluid bowl 211 to fill the space between the fluid bowl 211 and the platen 209 (above the fluid bowl seal 909) and to well up and over the periphery of the wafer 207. The electroless plating solution rises up and over the peripheral edge of the wafer in a substantially uniform manner so as to flow from the periphery of the wafer 207 toward the center of the wafer 207 in a substantially concentric manner.

Following a user defined time period for electroless plating reaction, the wafer 207 is subjected to a rinsing process. The rinsing process is performed in the lower region of the chamber 100 by way of the rinse nozzles 903 and blow down nozzles 905. To initiate the rinsing process, the platen 209 is raised to a rinse position so as to break its seal with the fluid bowl seal 909, thus allowing the fluid over the wafer to drain into the fluid bowl 211.

Following the wafer rinsing process, the wafer 207 is moved by way of the platen 209 to the wafer drying position, which is the same as the wafer handoff position. During the drying process, the wafer is held by the driver rollers 701 and stabilizer roller 605. The upper and lower prox heads 203/205 are used to perform the wafer drying process.

In one embodiment, flow to the upper and lower prox heads 203/205 is initiated with the prox heads at the prox head docking station 201. In another embodiment, the upper and lower prox heads 203/205 are moved to the center of the wafer 207 prior to initiating flow to the prox heads. If the flow is initiated at the prox head docking station 201, the upper and lower prox heads 203/205 are moved to the wafer center as the wafer is rotated. If the flow is initiated at the wafer center, the upper and lower prox heads 203/205 are moved to the wafer docking station 201 as the wafer is rotated. Wafer rotation during the drying process is initiated at an initial rotation speed and adjusted as the prox heads 203/205 are scanned across the wafer. In one embodiment, during the drying process, the wafer will be rotated a rate extending from about 0.25 revolution per minute (rpm) to about 10 rpm. The wafer rotation speed will vary as a function of the prox head 203/205 radial position over the wafer. Also, a scanning speed of the upper and lower prox heads 203/205 is initiated at an initial scan speed and adjusted as the prox heads 203/205 are scanned across the wafer. In one embodiment, the prox heads 203/205 are scanned across the wafer at a rate extending from about 1 mm/sec to about 75 mm/sec. At the conclusion of the drying process, the upper and lower prox heads 203/205 are moved to the prox head docking station 201.

During the drying process, the upper and lower prox heads 203/205 are positioned in close proximity to a top surface and a bottom surface 207B of the wafer 207, respectively. Once in this position, the prox heads 203/205 may utilize IPA and DIW source inlets and a vacuum source outlet to generate wafer processing meniscuses in contact with the wafer 207 which are capable of applying and removing fluids from the top and bottom surfaces of the wafer 207.

The portion of the DIW that is in the region between the prox heads 203/205 and the wafer 207 forms a dynamic liquid meniscus. It should be appreciated that as used herein, the ten "output" can refer to the removal of fluid from a region between the wafer 207 and a particular prox head 203/205, and the term "input" can be the introduction of fluid to the region between the wafer 207 and the particular prox head 203/205.

Figure 10:
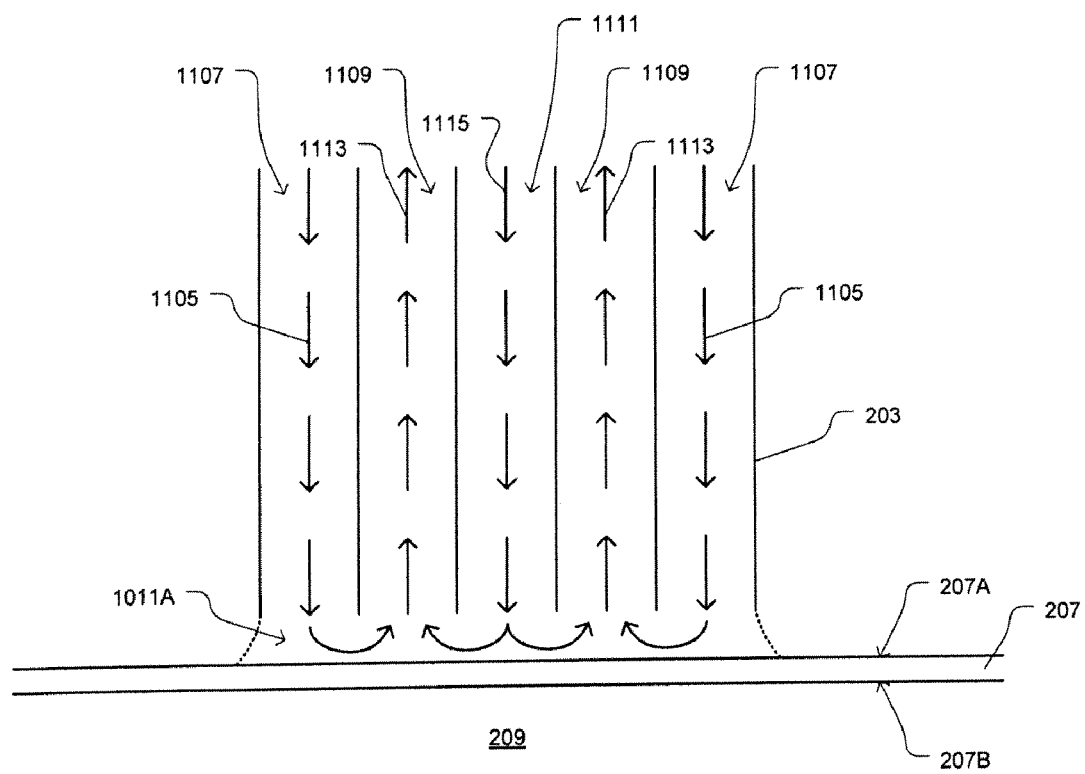
FIG. 10 is an illustration showing an exemplary process that may be conducted by a prox head, in accordance with one embodiment of the present invention.

FIG. 10 is an illustration showing an exemplary process that may be conducted by a prox head 203/205, in accordance with one embodiment of the present invention. Although FIG. 10 shows a top surface 207A of the wafer 207 being processed, it should be appreciated that the process may be accomplished in substantially the same way for a bottom surface 207B of the wafer 207. While FIG. 10 illustrates a substrate drying process, many other fabrication processes (e.g., etching, rinsing, cleaning, etc.) may also be applied to the wafer surface in a similar manner. In one embodiment, a source inlet 1107 may be utilized to apply isopropyl alcohol (IPA) vapor toward the top surface 207A of the wafer 207, and a source inlet 1111 may be utilized to apply deionized water (DIW) toward the top surface 207A. In addition, a source outlet 1109 may be utilized to apply vacuum to a region in close proximity to the surface 207A to remove fluid or vapor that may located on or near the surface 207A.

It should be appreciated that although IPA is utilized in the exemplary embodiment, any other suitable type of vapor may be utilized such as any suitable alcohol vapor, organic compounds, hexanol, ethyl glycol, etc. that may be miscible with water. Alternatives to IPA include but are not limited to the following: diacetone, diaceton alcohol, 1-methoxy-2-propanol, ethylglycol, methyl-pyrrolidon, ethyllactate, 2-butanol. These fluids may also be known as surface tension reducing fluids. The surface tension reducing fluids act to increase the surface tension gradient between the two surfaces (i.e., between the prox heads 203/205 and the surface of the wafer 207.

It should be appreciated that any suitable combination of source inlets and source outlets may be utilized as long as at least one combination exists where at least one of the source inlet 1107 is adjacent to at least one of the source outlet 1109 which is in turn adjacent to at least one of the source inlet 1111. The IPA may be in any suitable form such as, for example, IPA vapor where IPA in vapor form is inputted through use of a nitrogen carrier gas. Moreover, although DIW is utilized herein, any other suitable fluid may be utilized that may enable or enhance the substrate processing such as, for example, water purified in other ways, cleaning fluids, and other processing fluids and chemistries. In one embodiment, an IPA inflow 1105 is provided through the source inlet 1107, a vacuum 1113 is applied through the source outlet 1109, and DIW inflow 1115 is provided through the source inlet 1111. If a fluid film resides on the wafer 207, a first fluid pressure may be applied to the substrate surface by the IPA inflow 1105, a second fluid pressure may be applied to the substrate surface by the DIW inflow 1115, and a third fluid pressure may be applied by the vacuum 1113 to remove the DIW, IPA, and the fluid film on the substrate surface.

It should be appreciated that by controlling the fluid flow amount onto the wafer surface 207A and by controlling the vacuum applied, the meniscus 1011A may be managed and controlled in any suitable manner. For example, in one embodiment, by increasing the DIW flow 1115 and/or decreasing the vacuum 1113, the outflow through the source outlet 1109 may be nearly all DIW and the fluids being removed from the wafer surface 207A. In another embodiment, by decreasing the DIW flow 1115 and/or increasing the vacuum 1113, the outflow through the source outlet 1109 may be substantially a combination of DIW and IPA as well as fluids being removed from the wafer surface 207A.

Following the wafer drying process, the wafer 207 can be returned to the external module, e.g., MTM. In one embodiment, prior to opening the chamber 100 for return of the wafer 207, a verification is made that the pressure within the chamber 100 is sufficiently close to the pressure within the external module to which the chamber 100 internal volume will be exposed when the chamber 100 is opened to receive the wafer 207. In one embodiment, a sufficiently close pressure within the chamber 100 is within +/−10 Torr of the external module pressure. Also, prior to opening the chamber 100 for return of the wafer 207, a verification is made that the oxygen content within the chamber 100 is sufficiently close to the oxygen content within the external module to which the chamber 100 internal volume will be exposed when the chamber 100 is opened to receive the wafer 207. In one embodiment, a sufficiently close oxygen content within the chamber 100 is within +/−5 ppm of the external module oxygen content.

Figure 11:
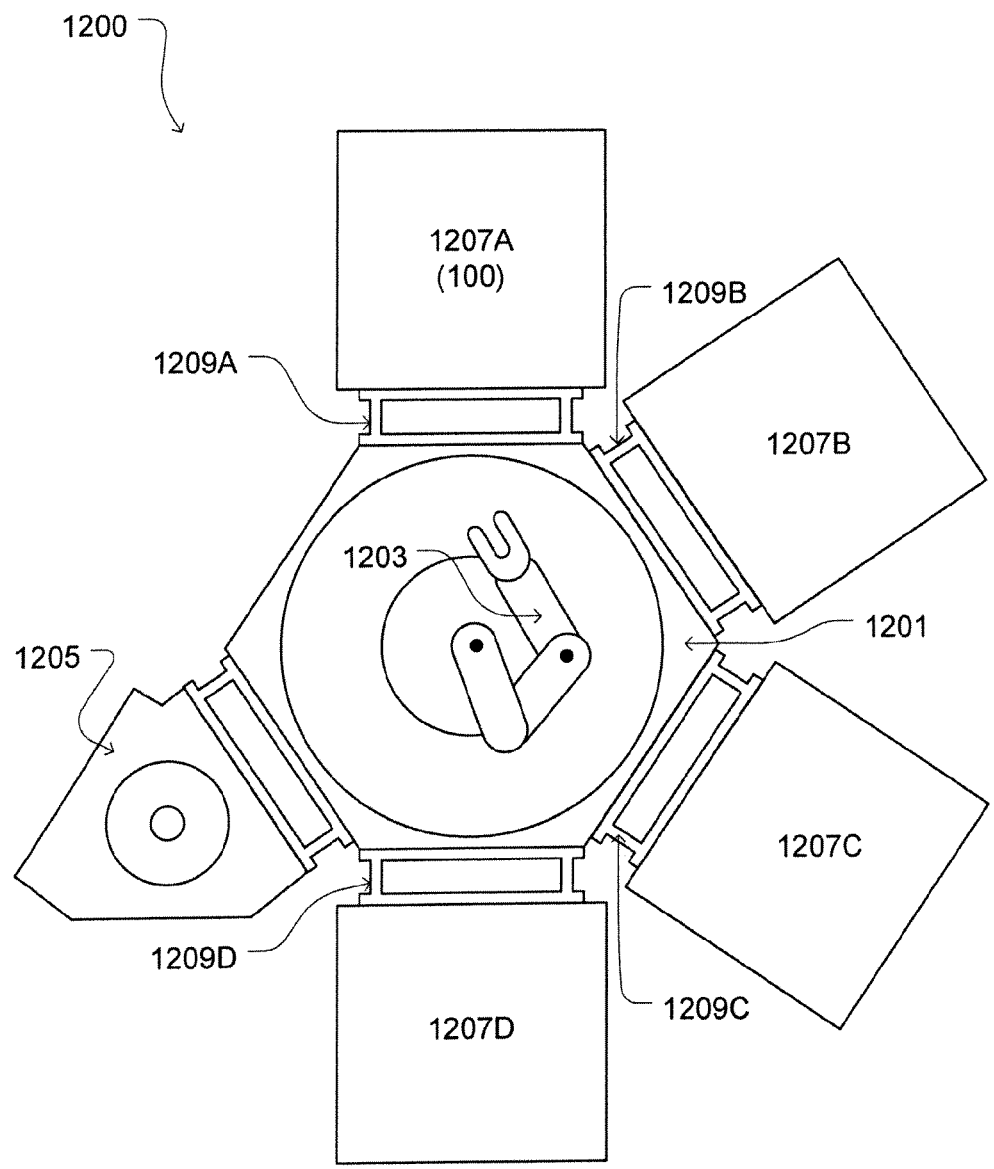
FIG. 11 is an illustration showing a cluster architecture, in accordance with one embodiment of the present invention.

FIG. 11 is an illustration showing a cluster architecture 1200, in accordance with one embodiment of the present invention. The cluster architecture 1200 includes a controlled ambient transfer module 1201, i.e., a managed transfer module (MTM) 1201. The MTM 1201 is connected to a load lock 1205 by way of a slot valve 1209E. The MTM 1201 includes a robotic wafer handling device 1203, i.e., end effector 1203, that is capable of retrieving a wafer from the load lock 1205. The MTM 1201 is also connected with a number of process modules 1207A, 1207B, 1207C, and 1207D through respective slot valves 1209A, 1209B, 1209C, and 1209D. In one embodiment, the processing modules 1207A-1207D are controlled ambient wet processing modules. The controlled ambient wet processing modules 1207A-1207D are configured to process a surface of a wafer in a controlled inert ambient environment. The controlled inert ambient environment of the MTM 1203 is managed such that an inert gas is pumped into the MTM 1203, and oxygen is purged out of the MTM 1203. In one embodiment, the electroless plating chamber 100 can be connected to the MTM 1203 as a processing module. For example, FIG. 11 shows that processing module 1207A is actually the dry-in/dry-out electroless plating chamber 100.

By removing all or most of the oxygen from the MTM 1203 and replacing it with an inert gas, the MTM 1203 will provide a transition environment which does not expose a just-processed wafer before or after an electroless plating process is performed thereon in the chamber 100. In specific embodiments, the other processing modules 1207B-1207D may be electroplating modules, electroless plating modules, dry-in/dry-out wet process modules, or other types of modules that will enable the application, formation, removal, or deposition of a layer on top of a wafer surface or feature, or other types of wafer processing.

In one embodiment, monitoring and control of the chamber 100 and interfacing equipment, e.g., FHS, is provided through a graphical user interface (GUI) operating on a computer system that is remotely located with respect to the processing environment. Various sensors within the chamber 100 and interfacing equipment are connected to provide a read out in the GUI. Each electronically actuated control within the chamber 100 and interfacing equipment can be actuated through the GUI. The GUI is also defined to display warnings and alarms based on various sensor readings within the chamber 100 and interfacing equipment. The GUI is further defined to indicate a process state and system conditions.

The chamber 100 of the present invention incorporates a number of advantageous features. For example, the implementation of upper and lower prox heads 203/205 within the chamber 100 provides the chamber 100 with a dry-in/dry-out wafer electroless plating process capability. The dry-in/dry-out capability enables the chamber 100 to interface with the MTM, enables tighter control of chemical reactions on the wafer surface, and prevents the carrying of chemicals outside of the chamber 100.

The double walled configuration of the chamber 100 also provides advantages. For example, the outer structural wall provides for strength and interface precision, while the inner liner provides a chemical boundary to keep chemicals from reaching the outer structural wall. Because the outer structure wall is responsible for providing the vacuum boundary, the inner liner does not have to be capable of providing a vacuum boundary, thus enabling the inner wall to be fabricated from inert materials such as plastic. Additionally, the inner wall is removable to facilitate chamber 100 cleaning or re-equipping. Also, the strength of the outer wall enables a decrease in time required to achieve an inert ambient condition within the chamber 100.

The chamber 100 provides for control of ambient conditions within the chamber 100. Use of an inert ambient condition during drying enables creation of a surface tension gradient (STG) which in turn enables the prox head processes. For example, a carbon dioxide ambient condition can be established within the chamber 100 to assist with creation of STG during the prox head drying process. The integration of STG drying, i.e., prox head drying, within a wet process chamber, i.e., within an electroless plating chamber, enables a multi-stage process capability. For example, the multi-stage process may include a pre-clean operation by way of the prox heads in the upper region of the chamber, an electroless plating process in the lower region of the chamber, and post-clean and drying operations by way of the prox heads in the upper region of the chamber.

Furthermore, the chamber 100 is configured to minimize an amount of required electroless plating solution, thereby enabling use of single-shot chemistry, i.e., single use and discard chemistry. Also, a point of use mixing approach is implemented to control electrolyte activation before deposition on wafer. This is accomplished by use of the mixing manifold which incorporates an injector tube, where the activating chemistry is injected into a flow stream of chemicals surrounding the injector tube, as close as possible to the fluid bowl dispense locations. This increases reactant stability, and reduces defects. Additionally, the quenching rinse capability of the chamber 100 provides for greater control over electroless plating reaction time on the wafer. The chamber 100 is further configured to be easily cleaned by introducing a "backflush" chemistry into the limited volume of the fluid bowl. The "backflush" chemistry is formulated to remove metal contaminants that may be introduced by the electroless plating solution. In other embodiments, the chamber 100 can be further configured to incorporate various types of in-situ metrology. Also, in some embodiments, the chamber 100 can include radiant or absorptive heating sources to initiate electroless plating reactions on the wafer.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A method for operating a semiconductor wafer electroless plating system, comprising:

receiving a wafer in a dry state within an upper region of a chamber volume;

performing an electroless plating process on the wafer within a lower region of the chamber volume below the upper region of the chamber volume;

performing a rinsing process on the wafer within the lower region of the chamber volume;

performing a drying process on the wafer within the upper region of the chamber volume above the lower region of the chamber volume; and providing the wafer in a dry state from the upper region of the chamber volume.

2. A method for operating a semiconductor wafer electroless plating system as recited in claim 1, wherein performing the electroless plating process on the wafer within the chamber volume includes, supporting the wafer in a fluid bowl, filling the fluid bowl with electroless plating solution so that the electroless plating solution rises up and over a periphery of the wafer so as to cover a top surface of the wafer, and draining the electroless plating solution from the top surface of the wafer following an electroless plating reaction period.

3. A method for operating a semiconductor wafer electroless plating system as recited in claim 1, wherein the rinsing process is performed on the wafer promptly after completion of the electroless plating process by dispensing a rinsing fluid onto a top surface of the wafer.

4. A method for operating a semiconductor wafer electroless plating system as recited in claim 1, wherein the drying process is performed on a top surface of the wafer by scanning an upper proximity head over the top surface of the wafer so as to subject the top surface of the wafer to a first dynamic liquid meniscus, and wherein the drying process is performed on a bottom surface of the wafer by scanning a lower proximity head over the bottom surface of the wafer so as to subject the bottom surface of the wafer to a second dynamic liquid meniscus.

5. A method for operating a semiconductor wafer electroless plating system as recited in claim 1, further comprising:

controlling an ambient condition within the chamber volume so as to minimize an oxygen content within the chamber volume.

6. A method for operating a semiconductor wafer electroless plating system as recited in claim 1, further comprising:

controlling a vapor pressure within the chamber to be at a saturated state relative to an electroless plating solution to be applied over the wafer.

7. A method for operating a semiconductor wafer electroless plating system as recited in claim 1, further comprising:

placing the wafer on a platen upon receiving the wafer in the dry state within the upper region of the chamber volume;

moving the platen vertically downward from the upper region of the chamber volume to the lower region of the chamber volume to perform the electroless plating process and rinsing process on the wafer within the lower region of the chamber volume; and moving the platen vertically upward from the lower region of the chamber volume to the upper region of the chamber volume to perform the drying process on the wafer within the upper region of the chamber volume.

8. A method for operating a semiconductor wafer electroless plating system as recited in claim 1, further comprising:

prior to performing the drying process on the wafer, positioning the wafer within the upper region of the chamber volume to be engaged by a drive roller assembly and a stabilizer assembly;

moving the stabilizer assembly to engage the wafer such that the wafer is engaged by both the drive roller assembly and the stabilizer assembly; and maintaining engagement of the wafer by both the drive roller assembly and the stabilizer assembly during performance of the drying process on the wafer within the upper region of the chamber volume.

9. A method for operating a semiconductor wafer electroless plating system as recited in claim 4, further comprising:

maintaining the upper proximity head at a position directly above the lower proximity head during the drying process.

10. A method for operating a semiconductor wafer electroless plating system as recited in claim 7, further comprising:

heating the platen in a controlled manner so as to enable control of a temperature of the wafer when present on the platen.

11. A method for operating a semiconductor wafer electroless plating system as recited in claim 7, further comprising:

applying a suction pressure through a number of vacuum channels within the platen to vacuum chuck the wafer to the platen.

12. A method for operating a semiconductor wafer electroless plating system as recited in claim 8, wherein the stabilizer assembly includes a stabilizer roller defined to engage an edge of the wafer and apply pressure to the edge of the wafer so as to hold the edge of the wafer in the drive roller.

13. A method for operating a semiconductor wafer electroless plating system as recited in claim 8, wherein the drive roller assembly includes a drive roller defined to engage an edge of the wafer and rotate the wafer.

14. A method for operating a semiconductor wafer electroless plating system as recited in claim 8, further comprising:

maintaining the wafer in a substantially horizontal orientation when the wafer is engaged by both the drive roller assembly and the stabilizer assembly.

15. A method for operating a semiconductor wafer electroless plating system as recited in claim 13, further comprising:

operating the drive roller assembly to rotate the wafer.

* * * * *